United States Patent
Shiozawa et al.

(10) Patent No.: US 7,683,398 B2
(45) Date of Patent: Mar. 23, 2010

(54) NITRIDE SEMICONDUCTOR DEVICE HAVING A SILICON-CONTAINING CONNECTION LAYER AND MANUFACTURING METHOD THEREOF

(75) Inventors: Katsuomi Shiozawa, Tokyo (JP); Kyozo Kanamoto, Tokyo (JP); Kazushige Kawasaki, Tokyo (JP); Hitoshi Sakuma, Tokyo (JP); Yuji Abe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 165 days.

(21) Appl. No.: 11/681,235

(22) Filed: Mar. 2, 2007

(65) Prior Publication Data
US 2008/0211062 A1 Sep. 4, 2008

(51) Int. Cl.
H01L 31/072 (2006.01)
H01L 29/24 (2006.01)
H01L 29/06 (2006.01)

(52) U.S. Cl. .................. 257/190; 257/103; 257/189; 257/615

(58) Field of Classification Search ............. 257/96, 257/97, 103, 615, E29.089, E29.144, 190; 257/189
See application file for complete search history.

(56) References Cited

U.S. PATENT DOCUMENTS

| 6,242,761 B1 * | 6/2001 | Fujimoto et al. ............. 257/94 |
| 6,281,526 B1 * | 8/2001 | Nitta et al. .................. 257/103 |
| 2007/0231978 A1 * | 10/2007 | Kanamoto et al. ......... 438/154 |

FOREIGN PATENT DOCUMENTS

| JP | 11-340571 | 12/1999 |
| JP | 2002-16312 | 1/2002 |
| JP | 2004-71657 | 3/2004 |

OTHER PUBLICATIONS

U.S. Appl. No. 11/691,049, filed Mar. 26, 2007, Kanamoto, et al.
U.S. Appl. No. 11/844,707, filed Aug. 24, 2007, Shiozawa, et al.

* cited by examiner

*Primary Examiner*—Hung Vu
(74) *Attorney, Agent, or Firm*—Oblon, Spivak, McClelland, Maier & Neustadt, L.L.P.

(57) ABSTRACT

A semiconductor device and a manufacturing method thereof are provided which enable reduction and enhanced stability of contact resistance between the back surface of a nitride substrate and an electrode formed thereover. A nitride semiconductor device includes an n-type GaN substrate (1) over which a semiconductor element is formed, and an n-electrode (10) as a metal electrode formed over the back surface of the GaN substrate (1). A connection layer (20) is formed between the GaN substrate (1) and the n-electrode (10), and the connection layer (20) is composed of a material that is other than nitride semiconductors and that contains silicon.

3 Claims, 6 Drawing Sheets

NITRIDE SEMICONDUCTOR DEVICE HAVING A SILICON-CONTAINING CONNECTION LAYER AND MANUFACTURING METHOD THEREOF

BACKGROUND OF THE INVENTION

1. Field of the Invention

The present invention relates to a nitride semiconductor device and a manufacturing method thereof, and particularly to a nitride semiconductor device having an n-electrode provided over the back surface of a nitride semiconductor substrate.

2. Description of the Background Art

As devices like blue light-emitting diodes (LEDs) and blue laser diodes (LDs) are put in practical use, nitride semiconductor devices using, e.g., gallium nitride (GaN), indium gallium nitride (InGaN), and aluminum gallium nitride (AlGaN), are attracting increased attention.

Usually, the crystals of nitride semiconductors, such as GaN, have hexagonal wurtzite structure. Accordingly, a nitride semiconductor substrate formed through crystal growth has a polarity, and so has a front surface called Ga surface and a back surface called N surface.

For the crystal growth of nitride semiconductors, it is known that the growth on the front surface (Ga surface) of a nitride semiconductor substrate offers good crystal quality. Accordingly, in the manufacture of nitride semiconductor devices, the layered-structure of the semiconductor element is usually formed by crystal growth of nitrides over the front surface of the nitride semiconductor substrate. Accordingly, in a laser diode as a conventional nitride semiconductor device, both of its n-electrode and p-electrode are formed over the front surface of the substrate. However, the manufacturing process then requires removing part of the layered-structure of the semiconductor element in order to expose the surface of the substrate, and this complicates the manufacturing process. Also, providing two electrodes on one side (on the front surface side) of the substrate requires a device formation area that is about two times larger than the area required when one electrode is formed on each side, which hinders miniaturization of the semiconductor device.

Accordingly, nitride semiconductor devices having electrodes on both sides are recently developed in which the n-electrode is formed over the back surface of the nitride semiconductor substrate (for example, see Japanese Patent Application Laid-Open Nos. 2004-71657 and 11-340571 (1999), which are hereinafter referred to respectively as Patent Document 1 and Patent Document 2).

Patent Document 2 discloses a technique in which, during a process of fabricating a laser diode, a GaN layer (n-contact layer) doped with silicon is grown on the back surface of a GaN substrate, and the n-type electrode is formed on the GaN layer.

On the back surface (N surface) of the nitride semiconductor substrate, deposited metal is more likely to exfoliate than on the front surface (Ga surface). Accordingly, a metal electrode formed on the back surface of the substrate tends to exhibit larger resistance (contact resistance) between the electrode and the substrate. For example, in a laser diode, if the contact resistance of the n-electrode is not sufficiently low, an increased voltage (operating voltage) is required to cause the laser diode to operate, and electric characteristics vary due to the generation of heat during operation. This makes it difficult to obtain stable output in the prescribed temperature range. It is therefore desirable to further reduce the contact resistance of the n-electrode provided over the back surface of the nitride semiconductor substrate.

When, as described in Patent Document 2, a silicon-doped GaN layer is grown on the back surface of a GaN substrate and an n-electrode is formed on the GaN layer, the n-electrode offers enhanced ohmic properties and enhanced adhesion as compared with conventional ones. However, when a thermal treatment is performed after the formation of the n-electrode, the reaction between the GaN layer surface and the n-electrode progresses and then the electric characteristics at the interface between the GaN layer and the n-electrode may be deteriorated, depending on the conditions of the thermal treatment (for example, the barrier height is increased (the tunneling is reduced)).

SUMMARY OF THE INVENTION

An object of the present invention is to provide a nitride semiconductor device and a manufacturing method thereof which enable reduction and enhanced stability of contact resistance between the back surface of a nitride substrate and an electrode formed thereover.

According to the present invention, a nitride semiconductor device includes: a nitride semiconductor substrate; a layered-structure of a nitride semiconductor element that is formed over a first main surface of the nitride semiconductor substrate; a metal electrode disposed over a second main surface of the nitride semiconductor substrate; and a connection layer formed between the nitride semiconductor substrate and the metal electrode. The connection layer is composed of a material that is other than nitride semiconductors and that contains silicon.

It is possible to stably maintain small contact resistance even when thermal treatment is performed after the formation of the metal electrode. Accordingly, the contact resistance of the metal electrode is not increased even through temperature variations in the device fabrication. That is, the contact resistance between the nitride semiconductor substrate and the metal electrode is kept small even after the completion of device fabrication. It is thus possible to reduce the operating voltage of the nitride semiconductor device and to lessen influences of heat generation, thus providing stable operating output and enabling high-power output.

According to the present invention, a method of manufacturing a nitride semiconductor device includes the following steps (a) to (d). The step (a) forms a layered-structure of a nitride semiconductor element over a first main surface of a nitride semiconductor substrate. The step (b) forms a connection layer over a second main surface of the nitride semiconductor substrate, the connection layer being composed of a material that is other than nitride semiconductors and that contains silicon. The step (c) forms a metal electrode on the connection layer. The step (d) performs a thermal treatment after the step (c).

The presence of the connection layer between the nitride semiconductor substrate and the metal electrode prevents the reaction between the metal electrode and the nitride semiconductor substrate during thermal treatment performed after the formation of the metal electrode. This prevents reduction of carrier concentration in the second main surface of the nitride semiconductor substrate that would be caused by the reaction, and prevents the increase of barrier height (the reduction of tunneling) between the nitride semiconductor substrate and the metal electrode. Thus, even when thermal treatment is performed, it is possible to stably maintain small contact resistance between the metal electrode and the nitride semiconductor substrate.

DESCRIPTION OF THE PREFERRED EMBODIMENTS

First Preferred Embodiment

Figure 1:
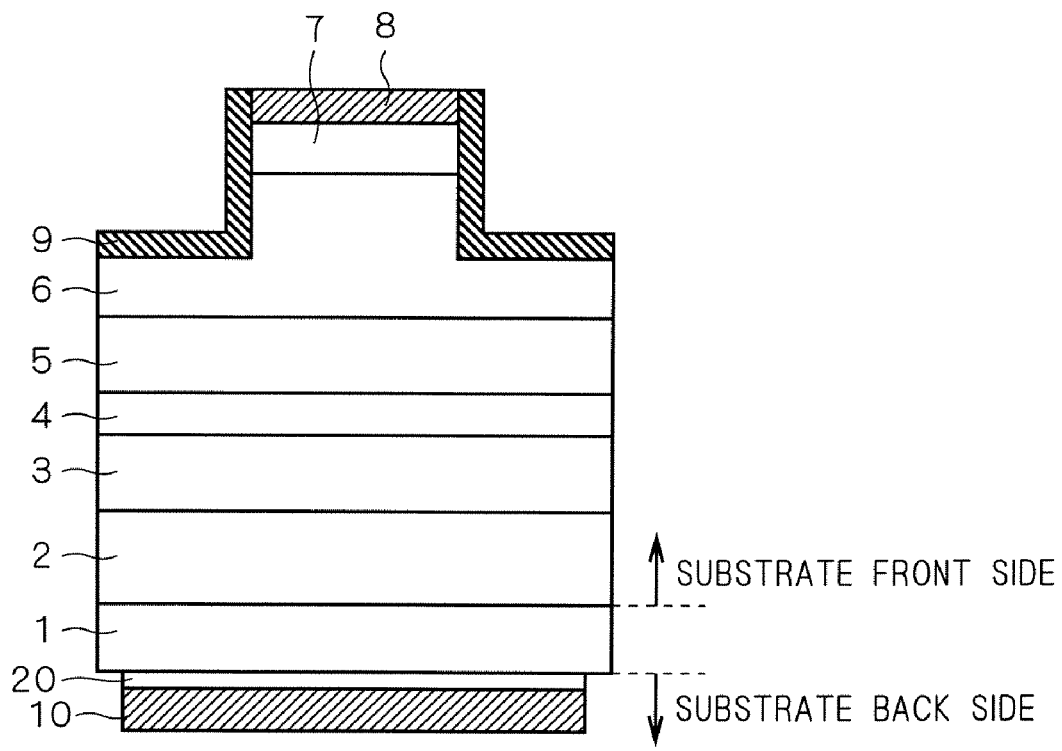
FIG. 1 is a diagram showing an example of the structure of a nitride semiconductor device according to a first preferred embodiment.

FIG. 1 is a diagram showing an example of the structure of a laser diode as a nitride semiconductor device according to a first preferred embodiment of the present invention. As shown in FIG. 1, the semiconductor device uses an n-type GaN substrate 1 as the nitride semiconductor substrate.

On the front surface (a first main surface), or the Ga surface, of the GaN substrate 1, an n-type AlGaN cladding layer 2, an n-type GaN guide layer 3, an active layer 4, a p-type GaN guide layer 5, a p-type AlGaN cladding layer 6, and a p-type GaN contact layer 7 are formed as a layered-structure of nitride semiconductors, and the GaN substrate 1 and the layered-structure form a laser diode device (a nitride semiconductor element). A p-electrode 8 is formed on the p-type GaN contact layer 7. The p-type AlGaN cladding layer 6 and the p-type GaN contact layer 7 are patterned in a given shape by etching. The p-electrode 8 is disposed on top of the p-type GaN contact layer 7. Also, an $SiO_2$ film 9, serving as a protective film, is formed to cover the upper part of the nitride semiconductor device, with the top surface of the p-electrode 8 exposed.

An n-electrode 10 is formed as a metal electrode over the back surface (a second main surface), or the N surface, of the GaN substrate 1. In this preferred embodiment, a connection layer 20 that is made of a certain material other than nitride semiconductors is provided between the n-electrode 10 and the GaN substrate 1.

The connection layer 20 is capable of electrically connecting the GaN substrate 1 and the n-electrode 10, and preferably, it causes no voltage loss. Also, the connection layer 20 is capable of stably offering good electric characteristics even when it experiences thermal treatment. Accordingly, it is desired that the connection layer 20 have a film thickness of 5 nm or less and be formed uniformly. When the connection layer 20 is too thick, it works as a resistance layer to cause increased voltage loss, and therefore it is preferable to form the connection layer 20 thin in a range in which the effects of the invention (described later) can be obtained.

In this preferred embodiment, the connection layer 20 is composed of a material that contains silicon. Specific examples thereof include hexamethyldisilazane (HMDS), which is an organic-silicon-based material, and siloxane-based or TEOS-based organic materials.

Figure 2:
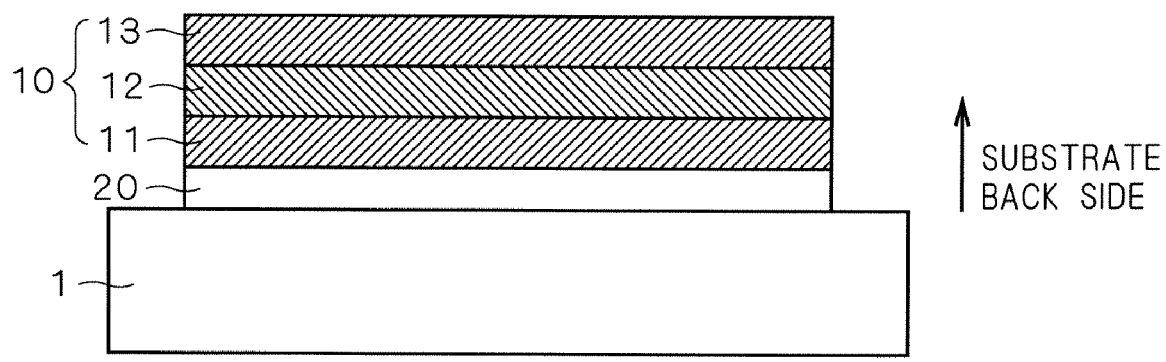
FIG. 2 is an enlarged cross-sectional view showing the back surface side of the substrate of the nitride semiconductor device of the first preferred embodiment.

FIG. 2 is an enlarged cross-sectional view showing the back surface side of the GaN substrate 1 of the nitride semiconductor device shown in FIG. 1. FIG. 2 shows the GaN substrate 1 with its back surface facing up, i.e., the GaN substrate 1 of FIG. 1 is turned upside down in FIG. 2.

As mentioned above, the connection layer 20 lies between the back surface of the GaN substrate 1 and the n-electrode 10. The n-electrode 10 has a three-layered structure including a Ti film 11, a Pt film 12, and an Au film 13, and the Ti film 11 forms the surface that connects with the connection layer 20. This offers good ohmic properties between the n-electrode 10 and the GaN substrate 1.

FIGS. 3 to 7 are process diagrams illustrating a process of manufacturing the nitride semiconductor device of this preferred embodiment, and the diagrams particularly show the process steps for forming the electrode structure on the back side of the GaN substrate 1 shown in FIG. 2. The process of forming the n-type AlGaN cladding layer 2, the n-type GaN guide layer 3, the active layer 4, the p-type GaN guide layer 5, the p-type AlGaN cladding layer 6, the p-type GaN contact layer 7, the p-electrode 8, and the $SiO_2$ film 9 over the front surface of the GaN substrate 1 shown in FIG. 1 is not described in detail herein, because they can be formed by conventional methods (for example, a method described in Patent Document 1 or 2).

Figure 3:
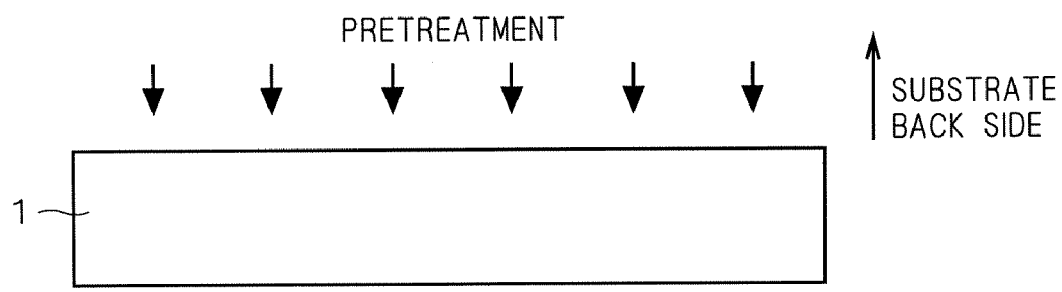
FIGS. 3 to 7 are process diagrams showing a method of manufacturing the nitride semiconductor device of the first preferred embodiment.

In the process of manufacturing the nitride semiconductor device of this preferred embodiment, given pretreatment processes are applied to the back surface of the GaN substrate 1, prior to the formation of the n-electrode 10 (FIG. 3). The pretreatment processes include polishing and grinding for thinning of the GaN substrate 1 and removal of damage layer, dry-etching for nitrogen defect formation, oxygen plasma treatment and BHF treatment for contamination removal, and the like.

For a specific example of the polishing and grinding process, the back surface of the GaN substrate 1 is first ground by about 100 to 200 μm with a grinding machine, next the ground surface is made flat with diamond slurry, and then it is polished with abrasive cloth using alumina as abrasive, for example. The dry-etching process may use Inductively Coupled Plasma (ICP), Reactive Ion Etching (RIE), or Electron Cyclotron Resonance (ECR). Chlorine (Cl)-based gas is used as the etching gas.

The oxygen plasma treatment is capable of removing surface contamination source of carbon, and the introduction of defects into the back layer of the GaN substrate 1 by the oxygen plasma treatment offers the effect of increasing the carrier concentration in a pseudo manner. The oxide-based layer formed on the back surface of the GaN substrate 1 due to the oxygen plasma treatment may be removed by BHF treatment when needed.

Figure 4:
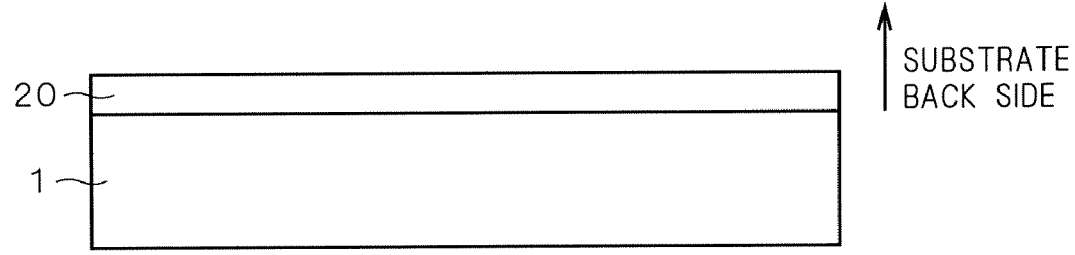

After the pretreatment has been finished, the connection layer 20 is formed on the back surface of the GaN substrate 1 (FIG. 4). The connection layer 20 may be formed by applying a solution that contains constituent material of the connection layer 20 onto the substrate 1, or by exposing it in an atmosphere that contains constituent material of the connection layer 20, for example.

Figure 5:
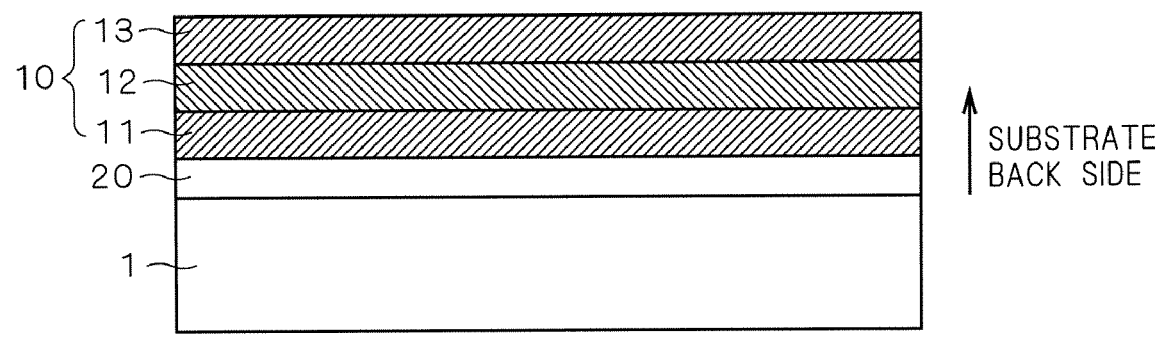

After the formation of the connection layer 20, the Ti film 11, the Pt film 12, and the Au film 13, for forming the n-electrode 10, are sequentially deposited over the back surface of the GaN substrate 1 by, e.g., Electron Beam (EB) evaporation (FIG. 5). The n-electrode 10 having the three-layered structure of Ti/Pt/Au is thus formed. The film thickness of the Ti film 11 can be about 10 to 100 nm. The Pt film 12 is formed to such a thickness as to obtain a barrier effect to prevent the reaction between the Ti film 11 and the Au film 13 in following thermal treatment, specifically to a thickness of about 50 to 100 nm. The Au film 13 requires such a film thickness that it will not be removed due to the reaction with solder during the device fabrication, and specifically a film thickness of about 200 nm or more is enough, for example.

Figure 6:
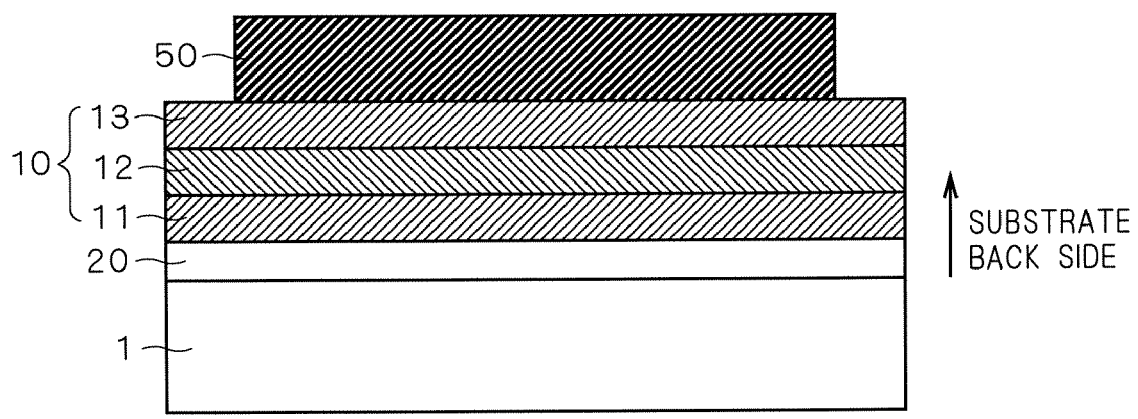
Figure 7:
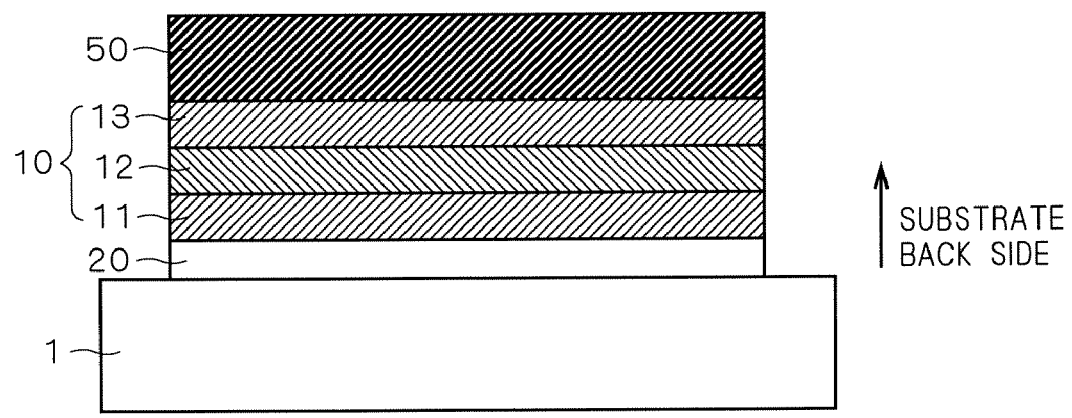

The n-electrode 10 is patterned as needed. That is, as shown in FIG. 6, a predeterminedly-patterned resist mask 50 is formed on the n-electrode 10, and unwanted part of the n-electrode 10 is removed by using the mask, e.g., by wet-etching or ion-milling (FIG. 7). The resist mask 50 is then removed.

The formation of the n-electrode 10 is followed by a thermal treatment. In this preferred embodiment, the n-electrode 10 is formed over the back surface of the GaN substrate 1 with the connection layer 20 sandwiched therebetween, and therefore the reaction between the n-electrode 10 and the GaN substrate 1 is prevented during the thermal treatment. This prevents the reduction of carrier concentration in the back layer of the GaN substrate 1 due to the reaction, and prevents the increase of barrier height (the reduction of tunneling) between the GaN substrate 1 and the n-electrode 10. Thus, even when thermal treatment is performed, it is possible to stably maintain small contact resistance between the n-electrode 10 and the GaN substrate 1.

This thermal treatment uses a temperature not lower than those used in the following device fabrication. The thermal treatment atmosphere may be of any of air, nitrogen, oxygen, and inert-gas. This thermal treatment stabilizes the contact resistance between the GaN substrate 1 and the n-electrode 10. It is desired that the contact resistance remain stable even through thermal treatment at 160° C. or higher, and it is more desired that it remain stable even through thermal treatment at 400° C. or higher.

The n-electrode structure of this preferred embodiment is thus formed on the back surface of the GaN substrate 1 through the process steps described above.

Figure 8:
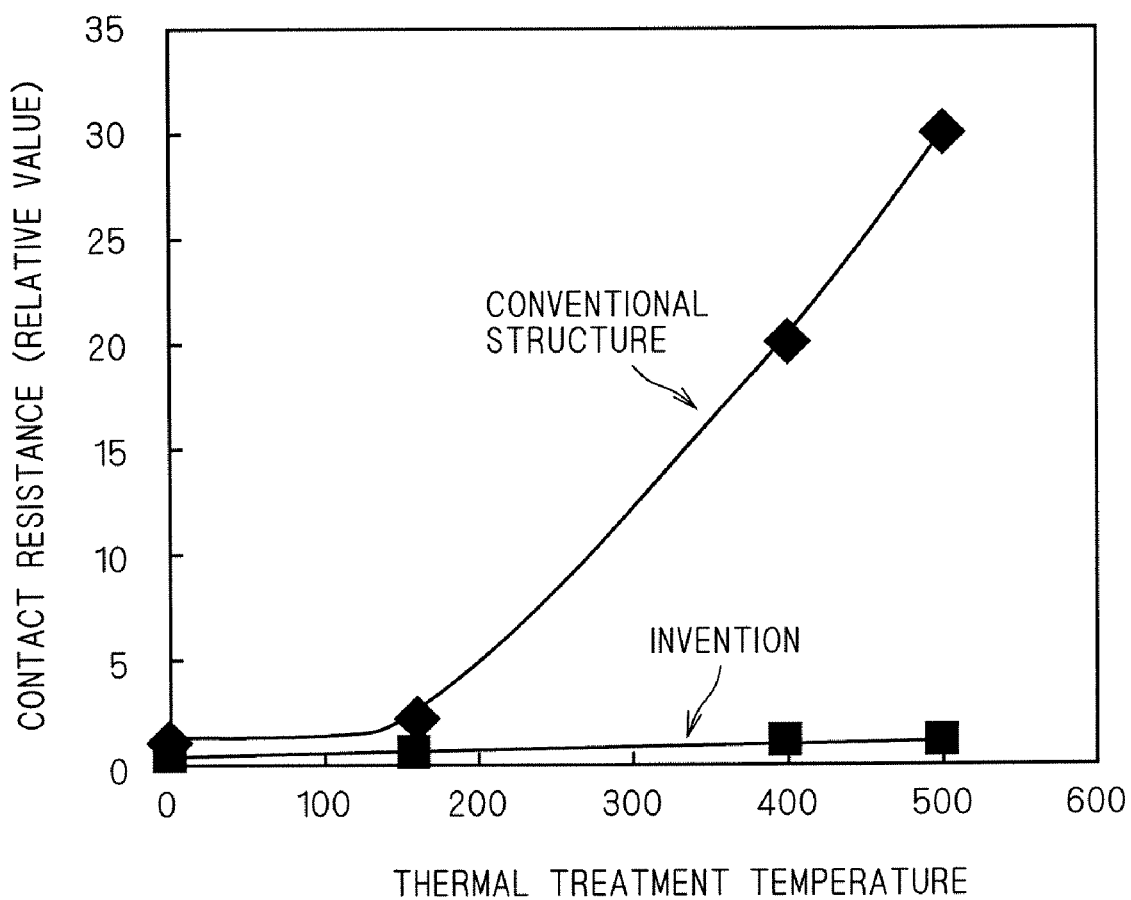
FIG. 8 is a graph used to describe an effect of the first preferred embodiment.

FIG. 8 is a graph used to describe the effect of the first preferred embodiment, which shows a relation between the temperature of thermal treatment performed after the formation of the n-electrode of a nitride semiconductor device and the contact resistance between the n-type GaN substrate and the n-electrode. The graph shows a comparison between a conventionally-structured device (i.e., a structure not having the connection layer 20 between the GaN substrate 1 and the n-electrode of FIG. 1) and the device of the first preferred embodiment. The n-electrode was made as a three-layered structure of Ti/Pt/Au in both devices. The values of contact resistance shown on the vertical axis in the graph are relative values that are obtained assuming that the conventional structure exhibits a contact resistance of "1" when not subjected to thermal treatment.

As shown in FIG. 8, in the conventionally-structured nitride semiconductor device, the contact resistance between the n-type GaN substrate and the n-electrode increases as the thermal treatment temperature becomes higher over 160° C. On the other hand, in the structure having the connection layer 20 of this preferred embodiment, the contact resistance between the n-type GaN substrate and the n-electrode is kept nearly fixed even when the thermal treatment temperature is increased. That is, the n-electrode of the preferred embodiment exhibits small contact resistance, and the contact resistance remains stable without depending on the thermal treatment temperature.

That is, according to this preferred embodiment, it is possible to stably maintain small contact resistance even when thermal treatment is performed after the formation of the n-electrode 10. The contact resistance of the n-electrode 10 is thus not increased even through temperature variations in the device fabrication. That is, the contact resistance between the GaN substrate 1 and the n-electrode 10 is kept small even after the completion of the device fabrication. It is thus possible to reduce the operating voltage of the nitride semiconductor device and to lessen influences of heat generation, which provides stable operating output and enables high-power output.

Also, the adhesion of the n-electrode 10 is enhanced because the n-electrode 10 made of metal is positioned not directly on the back surface of the GaN substrate 1 but with the connection layer 20 sandwiched therebetween. Furthermore, it is possible to enlarge the temperature margin in thermal treatment because the contact resistance of the n-electrode is stable and does not depend on the thermal treatment temperature.

This preferred embodiment has shown an example in which the n-electrode 10 has a three-layered structure of Ti/Pt/Au, but the same effects are obtained with a two-layered structure of Ti/Al or a two-layered structure of Ti/Au, for example (in both cases, the Ti layer is placed in contact with the connection layer 20). Other possible structures of the n-electrode include single-layered or multi-layered structures in which a material having a work function of 5 eV or less, e.g., Al, Ta, TiN, etc., is placed in contact with the connection layer 20.

Also, the example above uses an n-type GaN substrate as a nitride semiconductor substrate, but this preferred embodiment is applicable also to nitride semiconductor layers of gallium nitride (GaN), indium gallium nitride (InGaN), aluminum gallium nitride (AlGaN), etc.

Second Preferred Embodiment

Figure 9:
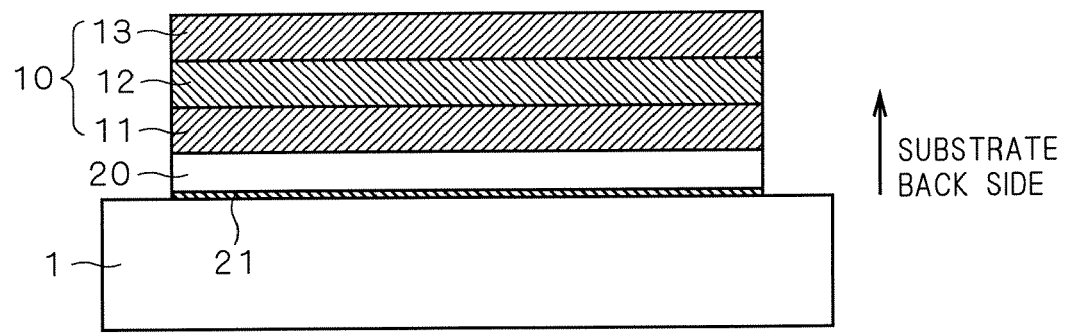
FIG. 9 is an enlarged cross-sectional view showing the back surface side of the substrate of a nitride semiconductor device according to a second preferred embodiment.

FIG. 9 is an enlarged cross-sectional view showing the back surface side of the GaN substrate 1 of a nitride semiconductor device according to a second preferred embodiment. In FIG. 9, the same components as those of FIG. 2 are shown at the same reference characters.

As shown in FIG. 9, the nitride semiconductor device of this preferred embodiment has an oxide film 21 that is thin (hereinafter referred to as "a thin oxide film") between the back surface of the GaN substrate 1 and the connection layer 20 (i.e., at the interface between the GaN substrate 1 and the connection layer 20). In other respects, the nitride semiconductor device is structured the same as the nitride semiconductor device of the first preferred embodiment (described with FIGS. 1 and 2).

Providing the thin oxide film 21 at the interface between the GaN substrate 1 and the connection layer 20 enhances the adhesion between the GaN substrate 1 and the connection layer 20, i.e., the adhesion between the GaN substrate 1 and the n-electrode 10, in addition to the effects described in the first preferred embodiment. It is necessary that the thin oxide film 21 not electrically insulate the n-electrode 10 and the GaN substrate 1 from each other, since the n-electrode 10 has to be electrically connected to the GaN substrate 1. For example, when the thin oxide film 21 is formed to a thickness of 1 nm or less, it does not function as a so-called "insulating film", but it allows passage of current through the thin oxide film 21, and then the electric connection between the n-electrode 10 and the GaN substrate 1 is ensured. It is not necessary to form the thin oxide film 21 with a uniform thickness, because the purpose of the formation of the thin oxide film 21 is not insulation.

Figure 12:
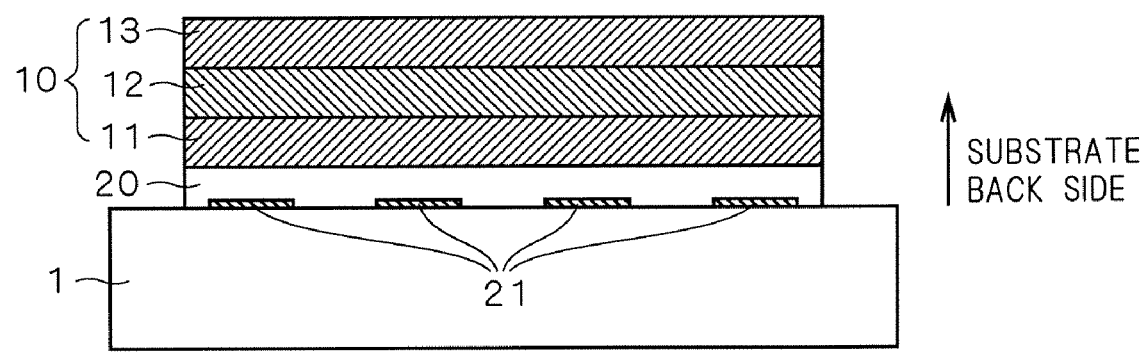
FIG. 12 is a diagram showing a modification of the nitride semiconductor device of the second preferred embodiment.

Also, instead of the thin oxide film 21 formed in the entire area of the interface between the GaN substrate 1 and the connection layer 20, the thin oxide film 21 may be formed partially (like islands, for example), e.g., as shown in FIG. 12, for the purpose of ensuring electric connection between the n-electrode 10 and the GaN substrate 1 (in this case, too, a thickness of 1 nm or less is desirable). In view of the ohmic properties between the n-electrode 10 and the GaN substrate 1, it is rather preferable to partially form the thin oxide film 21.

According to this preferred embodiment, the adhesion between the GaN substrate 1 and the n-electrode 10 is enhanced, and so the contact resistance between the GaN substrate 1 and the n-electrode 10 is further reduced. This allows reduction of the operating voltage of the nitride semiconductor device, reduces influences of heat generation, and provides stable operating output and enables high-power output.

A method of manufacturing the nitride semiconductor device of this preferred embodiment, particularly process steps for forming the electrode structure on the back surface of the GaN substrate 1 shown in FIG. 9, will be described below.

Figure 10:
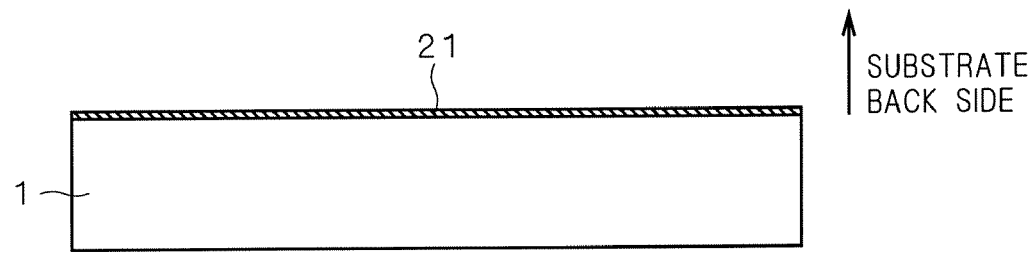
FIGS. 10 and 11 are process diagrams showing a method of manufacturing the nitride semiconductor device of the second preferred embodiment.

In this preferred embodiment, as in the first preferred embodiment, given pretreatment processes are applied to the back surface of the GaN substrate 1 prior to the formation of the n-electrode 10, and the thin oxide film 21 is formed during the pretreatment (FIG. 10). The thin oxide film 21 may be formed by exposing the back surface of the GaN substrate 1 in an atmosphere of oxygen, by exposing it in an atmosphere of oxygen plasma or oxygen radical, or by performing chemical treatment using an oxidizing chemical (e.g., oxidation with a mixed solution of $H_2SiF_6$ and $H_3BO_3$, or anodic oxidation with N-methylacetamide), for example.

It is desired that the thin oxide film 21 formed in this process have a thickness of 1 nm or less, in order to ensure electric connection between the n-electrode 10 and the GaN substrate 1. Alternatively, the thin oxide film 21 may once be formed somewhat thick and then thinned to 1 nm or less by BHF treatment. Or, the thin oxide film 21 may be once formed on the entire back surface of the GaN substrate 1 and then partially removed by BHF treatment such that it partially remains as shown in FIG. 12.

Figure 11:
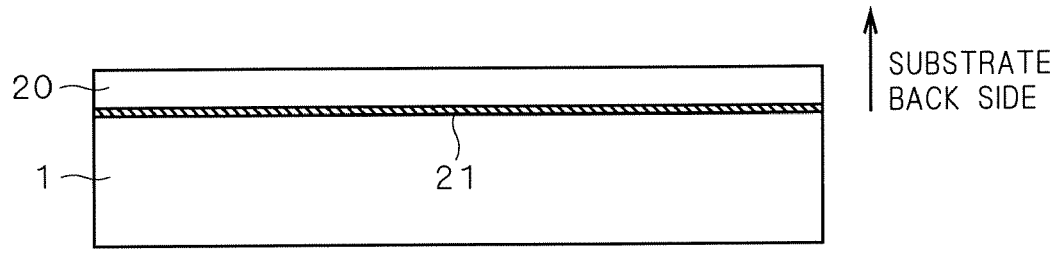

Then, with the thin oxide film 21 remaining on the back surface of the GaN substrate 1, the connection layer 20 is formed thereon (FIG. 11). The connection layer 20 may be formed by applying a solution that contains constituent material of the connection layer 20 onto the substrate 1, or by exposing it in an atmosphere that contains constituent material of the connection layer 20, for example.

After that, as described in the first preferred embodiment, the n-electrode 10 is formed, and patterned as needed, and given thermal treatment is performed, so as to complete the n-electrode structure of this preferred embodiment on the back surface of the GaN substrate 1.

While the invention has been described in detail, the foregoing description is in all aspects illustrative and not restrictive. It is understood that numerous other modifications and variations can be devised without departing from the scope of the invention.

What is claimed is:

1. A nitride semiconductor device comprising:
   a nitride semiconductor substrate;
   a layered-structure of a nitride semiconductor element that is formed over a first main surface of said nitride semiconductor substrate;
   a metal electrode disposed over a second main surface of said nitride semiconductor substrate; and
   a connection layer formed between said nitride semiconductor substrate and said metal electrode,
   said connection layer comprising a material that is other than nitride semiconductors and that contains silicon,
   wherein said connection layer comprises an organic material that contains silicon.

2. A nitride semiconductor device comprising:
   a nitride semiconductor substrate;
   a layered-structure of a nitride semiconductor element that is formed over a first main surface of said nitride semiconductor substrate;
   a metal electrode disposed over a second main surface of said nitride semiconductor substrate; and
   a connection layer formed between said nitride semiconductor substrate and said metal electrode,
   said connection layer comprising a material that is other than nitride semiconductors and that contains silicon,
   wherein an oxide film is formed at least in part of an interface between said nitride semiconductor substrate and said connection layer.

3. The nitride semiconductor device according to claim 2, wherein said oxide film has a thickness of 1 nm or less.

* * * * *